United States Patent
Moon et al.

(10) Patent No.: US 7,646,003 B2
(45) Date of Patent: Jan. 12, 2010

(54) FOCUSING APPARATUS AND LITHOGRAPHY SYSTEM USING THE SAME

(75) Inventors: Chang-Wook Moon, Seoul (KR);
Dong-Soo Kim, Anyang-si (KR);
Myung-Gon Song, Gyeongju-si (KR);
Seung-Woon Lee, Yongin-si (KR);
Yun-Sang Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 243 days.

(21) Appl. No.: 11/311,282

(22) Filed: Dec. 20, 2005

(65) Prior Publication Data
US 2006/0151712 A1 Jul. 13, 2006

(30) Foreign Application Priority Data
Dec. 21, 2004 (KR) .................. 10-2004-0109269

(51) Int. Cl.
*H01J 37/22* (2006.01)
(52) U.S. Cl. .................. 250/492.22; 250/396 ML; 250/310
(58) Field of Classification Search ............ 250/492.22, 250/492.2
See application file for complete search history.

(56) References Cited

U.S. PATENT DOCUMENTS

| | | | | |
|---|---|---|---|---|
| 3,781,735 A | * | 12/1973 | Haas ............... | 335/298 |
| 3,862,393 A | * | 1/1975 | Dundas et al. ......... | 219/121.36 |
| 4,672,346 A | | 6/1987 | Miyamoto et al. | |
| 5,057,689 A | * | 10/1991 | Nomura et al. ............ | 250/310 |
| 5,330,853 A | * | 7/1994 | Hofmann et al. ............ | 428/697 |
| 5,395,738 A | * | 3/1995 | Brandes et al. ............ | 430/296 |
| 6,515,292 B1 | * | 2/2003 | Scherer et al. ......... | 250/492.24 |
| 6,777,166 B2 | * | 8/2004 | Weickenmeier ............ | 430/296 |
| 6,870,173 B2 | | 3/2005 | Moon et al. | |
| 2004/0173755 A1 | | 9/2004 | Moon et al. | |

FOREIGN PATENT DOCUMENTS

| | | |
|---|---|---|
| CN | 2295264 | 10/1998 |
| CN | 1527358 | 9/2004 |

OTHER PUBLICATIONS

Office Action dated Feb. 15, 2008 for counterpart Chinese Application No. 2005101269745 and English translation thereof.

* cited by examiner

*Primary Examiner*—David A. Vanore
*Assistant Examiner*—Phillip A. Johnston
(74) *Attorney, Agent, or Firm*—Harness, Dickey & Pierce, P.L.C.

(57) ABSTRACT

A focusing apparatus and a lithography system using the same capable of adjusting a uniformity of an electromagnetic field by moving a portion of a magnetic field generator. The focusing apparatus may control a path of an electron beam generated from an electron-beam emitter of the lithography system. In the focusing apparatus, a uniformity of the magnetic field in the vacuum chamber may be adjusted through movement of the portion of the magnetic field generator with respect to the vacuum chamber.

32 Claims, 5 Drawing Sheets

FOCUSING APPARATUS AND LITHOGRAPHY SYSTEM USING THE SAME

PRIORITY STATEMENT

This application claims the benefit of Korean Patent Application No. 10-2004-0109269, filed on Dec. 21, 2004, in the Korean Intellectual Property Office, the disclosure of which is incorporated herein in its entirety by reference.

BACKGROUND OF THE INVENTION

1. Field of the Invention

Example embodiments of the present invention relate to a focusing apparatus and a lithography system using the same, and more particularly, to a focusing apparatus and a lithography system using the same, which can adjust a uniformity of an electromagnetic field.

2. Description of the Related Art

Various lithography techniques may be used for patterning a surface of a substrate into a desired pattern in a semiconductor manufacturing process. An optical lithography technique may be used for surface patterning. However, optical lithography techniques may have a limitation with regard to a possible linewidth. Accordingly, a next generation lithography (NGL) technique capable of realizing a finer semiconductor integrated circuit (IC) having a nano-dimensional linewidth has been proposed. Examples of NGLs include electron-beam lithography (EBL), ion-beam lithography (IBL), extreme-ultraviolet lithography (EUL), and proximity X-ray lithography (PXL).

An EBL system is a type of system for patterning an electron resist coated on a substrate into a desired pattern using an electron beam. In a conventional EBL system, an electron beam can be emitted only on a very-limited area, and thus an emitter emits an electron beam toward an electron resist while moving along a pattern to be formed on the electron resist. Accordingly, a conventional EBL system may undesirably require a lot of time to complete one pattern.

A structure of a conventional electron-beam lithography system capable of emitting a large-area electron beam is schematically illustrated in FIG. 1.

Referring to FIG. 1, a conventional electron-beam lithography system may include a vacuum chamber 10 surrounding a space for processing a wafer 30. The interior of the vacuum chamber 10 may maintain a desired vacuum state via a vacuum pump 12. The vacuum pump 12 may be made of nonmagnetic material, for example, plastic, aluminum, aluminum alloy, stainless steel, or copper so as to reduce or prevent a magnetic flux from leaking therefrom.

An electron-beam emitter 20 for emitting an electron beam may be arranged in the vacuum chamber 10, and the wafer 30 may be arranged to face the electron-beam emitter 20 while being spaced apart therefrom by a desired interval. The electron-beam emitter 20 may have thereon a patterned mask 22 of a desired pattern, and thus an electron beam emitted from the emitter 20 may be emitted through a portion not covered with the patterned mask 22. The emitted electrons may pattern an electron resist 32 on the wafer 30 into a pattern identical to the pattern of the mask 22.

The wafer 30 may be supported by a wafer holder 42 in the vacuum chamber 10, and the electron-beam emitter 20 may be supported by an emitter holder 41 in the vacuum chamber 10.

An upper magnet 61 may be arranged proximate to an upper portion of the vacuum chamber 10 in such a way to be spaced apart from a top wall of the vacuum chamber 10 by a desired interval, and a lower magnet 62 may be arranged proximate to a lower portion of the vacuum chamber 10 in such a way to be spaced apart from a bottom wall of the vacuum chamber 10 by a desired interval. The upper and lower magnets 61 and 62 may provide a magnetic field in the vacuum chamber 10. The upper magnet 61 may include a ferromagnetic core 61a and a coil 61b wound around the periphery of the core 61a, and the lower magnet 62 may include a ferromagnetic core 62a and a coil 62b wound around the periphery of the core 62a.

An upper pole piece 71 may be arranged to penetrate the top wall of the vacuum chamber 10, and magnetically come into contact with the core 61a of the upper magnet 61. Similarly, a lower pole piece 72 may be arranged to penetrate the bottom wall of the vacuum chamber 10, and magnetically come into contact with the core 62a of the lower magnet 62. The upper and lower pole pieces 71 and 72 and the vacuum chamber 10 may be completely sealed with each other so as to maintain a vacuum state in the vacuum chamber 10.

The pole pieces 71 and 72 may lead magnetic fluxes generated by the upper and lower magnets 61 and 62, respectively, into the vacuum chamber 10. A rubber or ductile metal plate 81 containing ferromagnetic material may be interposed between the upper magnet 61 and the upper pole piece 71 in order for the upper magnet 61 and the upper pole piece 71 to completely come into contact with each other, and a rubber or ductile metal plate 82 containing ferromagnetic material may be interposed between the lower magnet 62 and the lower pole piece 72 in order for the lower magnet 62 and the lower pole piece 72 to completely come into contact with each other.

A ring-type upper protrusion 91 may be formed on a lower surface of the upper pole piece 71, and a ring-type lower protrusion 92 may be formed on an upper surface of the lower pole piece 72. The upper and lower protrusions 91 and 92 may increase the uniformity of a magnetic field formed between the electron-beam emitter 20 and the wafer 30.

However, a conventional electron-beam lithography system, such as the one illustrated in FIG. 1 cannot suitably compensate for a size change of the wafer 30 resulting from a temperature change, because the positions of the upper and lower pole pieces 71 and 72 are fixed. That is, the size of the wafer 30 may change with a temperature change in the vacuum chamber 10 during the patterning of the electron resist 32, whereby the size of the pattern formed on the electron resist 32 may also be changed slightly. Such a size change may cause a problem when a linewidth of several ten nanometers needs to be realized via a semiconductor manufacturing process.

SUMMARY OF THE INVENTION

Example embodiment of the present invention may provide a focusing apparatus and a lithography system using the same, and more particularly, to a focusing apparatus and a lithography system using the same, which can adjust a uniformity of an electromagnetic field.

Example embodiment of the present invention may provide an electromagnetic focusing apparatus and an electron-beam lithography system using the same, and more particularly, to an electromagnetic focusing apparatus and an electron-beam lithography system using the same, which can adjust a uniformity of an electromagnetic field.

According to an example embodiment of the present invention, there is provided a focusing apparatus for controlling a path of an electron beam generated from an electron-beam emitter of a lithography system, the apparatus including a magnetic field generator forming a magnetic field in a vacuum chamber surrounding a space into which a wafer is located, a portion of the magnetic field generator arranged partially within a boundary of the vacuum chamber, wherein a uniformity of the magnetic field in the vacuum chamber may be adjusted through movement of the portion of the magnetic field generator with respect to the vacuum chamber.

According to an example embodiment of the present invention, the portion of the magnetic field generator is moved vertically with respect to the vacuum chamber.

According to an example embodiment of the present invention, the portion of the magnetic field generator interacts with a portion of the vacuum chamber to move vertically with respect to the vacuum chamber.

According to an example embodiment of the present invention, the portion of the magnetic field generator and the portion of the vacuum chamber each include threads to move the portion of the magnetic field generator vertically with respect to the vacuum chamber.

According to an example embodiment of the present invention, the portion includes upper and lower pole pieces penetrating top and bottom walls of the vacuum chamber, respectively, arranged to face each other, wherein the uniformity of the magnetic field in the vacuum chamber may be adjusted through vertical movement of the upper and lower pole pieces with respect to the vacuum chamber.

According to an example embodiment of the present invention, there is provided a lithography system including a vacuum chamber surrounding a space into which a wafer is located, an electron-beam emitter arranged in the vacuum chamber to face the wafer and to be spaced apart from the wafer by a given interval and emitting an electron beam toward the wafer and an electromagnetic focusing apparatus controlling a path of an electron beam generated from the electron-beam emitter, the electromagnetic focusing apparatus including a magnetic field generator forming a magnetic field in the vacuum chamber, a portion of the magnetic field generator arranged partially within a boundary of the vacuum chamber, wherein a uniformity of the magnetic field in the vacuum chamber may be adjusted through movement of the portion of the magnetic field generator with respect to the vacuum chamber.

According to an example embodiment of the present invention, the portion of the magnetic field generator is moved vertically with respect to the vacuum chamber.

According to an example embodiment of the present invention, the portion of the magnetic field generator interacts with a portion of the vacuum chamber to move vertically with respect to the vacuum chamber.

According to an example embodiment of the present invention, the portion of the magnetic field generator and the portion of the vacuum chamber each include threads to move the portion of the magnetic field generator vertically with respect to the vacuum chamber.

According to an example embodiment of the present invention, the portion includes upper and lower pole pieces penetrating top and bottom walls of the vacuum chamber, respectively, arranged to face each other, wherein the uniformity of the magnetic field in the vacuum chamber may be adjusted through vertical movement of the upper and lower pole pieces with respect to the vacuum chamber.

Example embodiment of the present invention may provide a focusing apparatus and a lithography system using the same, and more particularly, to a focusing apparatus and a lithography system using the same, which can adjust a uniformity of an electromagnetic field by moving a center position of a pole piece.

Example embodiment of the present invention may provide an electromagnetic focusing apparatus and an electron-beam lithography system using the same, and more particularly, to an electromagnetic focusing apparatus and an electron-beam lithography system using the same, which can adjust a uniformity of an electromagnetic field by moving a center position of a pole piece.

Example embodiments of the present invention may provide an electromagnetic focusing apparatus and an electron-beam lithography system using the same, which can compensate for a wafer size change due to a temperature change in a vacuum chamber by adjusting a uniformity of an electromagnetic field through the movement of a center position of a pole piece.

Example embodiments of the present invention may also provide an electromagnetic focusing apparatus and an electron-beam lithography system using the same, which can reduce the space of the system and the manufacturing cost of a large magnet.

According to an example embodiment of the present invention, there is provided an electromagnetic focusing apparatus for controlling a path of an electron beam generated from an electron-beam emitter of an electron-beam lithography system. The electromagnetic focusing apparatus may include a magnetic field generator forming a magnetic field in a vacuum chamber surrounding a space into which a wafer is located, and upper and lower pole pieces penetrating top and bottom walls of the vacuum chamber, respectively arranged to face each other, and applying a magnetic field formed at the magnetic field generator into the vacuum chamber. A uniformity of a magnetic field in the vacuum chamber may be adjusted through vertical movement of the upper and lower pole pieces with respect to the vacuum chamber.

In an example embodiment, the upper and lower pole pieces may be made of a ferromagnet.

In an example embodiment, the magnetic field generator may be an electromagnet including a core and coils, the core may be the upper and lower pole pieces, and the coils may be wound around peripheries of the upper and lower pole pieces, respectively, protruding outside the vacuum chamber.

In an example embodiment, an electromagnetic focusing apparatus may further include a magnetic path unit via which a magnetic flux generated at the magnetic field generator moves from the upper pole piece, passes through the vacuum chamber and the lower pole piece, and circulates back to the upper pole piece. In an example embodiment, the magnetic path unit may have both end portions magnetically coming into contact with the upper and lower pole pieces, respectively, protruding outside the vacuum chamber, and may ferromagnetic surrounding at least one of left and right sides of the vacuum chamber.

In an example embodiment, the magnetic field generator may be an electromagnet including a magnetic path unit having both end portions magnetically coming into contact with the upper and lower pole pieces protruding outside the vacuum chamber, respectively and a coil wound around a periphery of the magnetic path unit.

In an example embodiment, the electromagnetic focusing apparatus may further include upper and lower reinforcement members arranged to penetrate top and bottom walls of the vacuum chamber, respectively, formed of ferromagnetic material surrounding a periphery of the upper and lower pole pieces, respectively. In an example embodiment, end portions of the upper and lower reinforcement members may protrude into an inside of the vacuum chamber farther than end portions of the upper and lower pole pieces to thereby form a ring-type magnetic field compensator.

In an example embodiment, the upper and lower reinforcement members may be movably connected with the upper and lower pole pieces, respectfully, through a screw thread formed on inner peripheries of the upper and lower reinforcement members and a screw thread formed on outer peripheries of the upper and lower pole pieces.

According to another example embodiment of the present invention, there is provided an electron-beam lithography system including a vacuum chamber surrounding a space into which a wafer is located, an electron-beam emitter arranged in the vacuum chamber in such a way to face the wafer and to be spaced apart from the wafer by a given interval and emitting an electron beam toward the wafer, and an electromagnetic focusing apparatus controlling a path of an electron beam generated from the electron-beam emitter. The electromagnetic focusing apparatus may include a magnetic field generator forming a magnetic field in the vacuum chamber and upper and lower pole pieces penetrating top and bottom walls of the vacuum chamber, respectfully, the upper and lower pole pieces arranged to face each other, and applying a magnetic field formed at the magnetic field generator into the vacuum chamber, wherein a uniformity of a magnetic field in the vacuum chamber can be adjusted through vertical movement of the upper and lower pole pieces with respect to the vacuum chamber.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS OF THE PRESENT INVENTION

Figure 1:
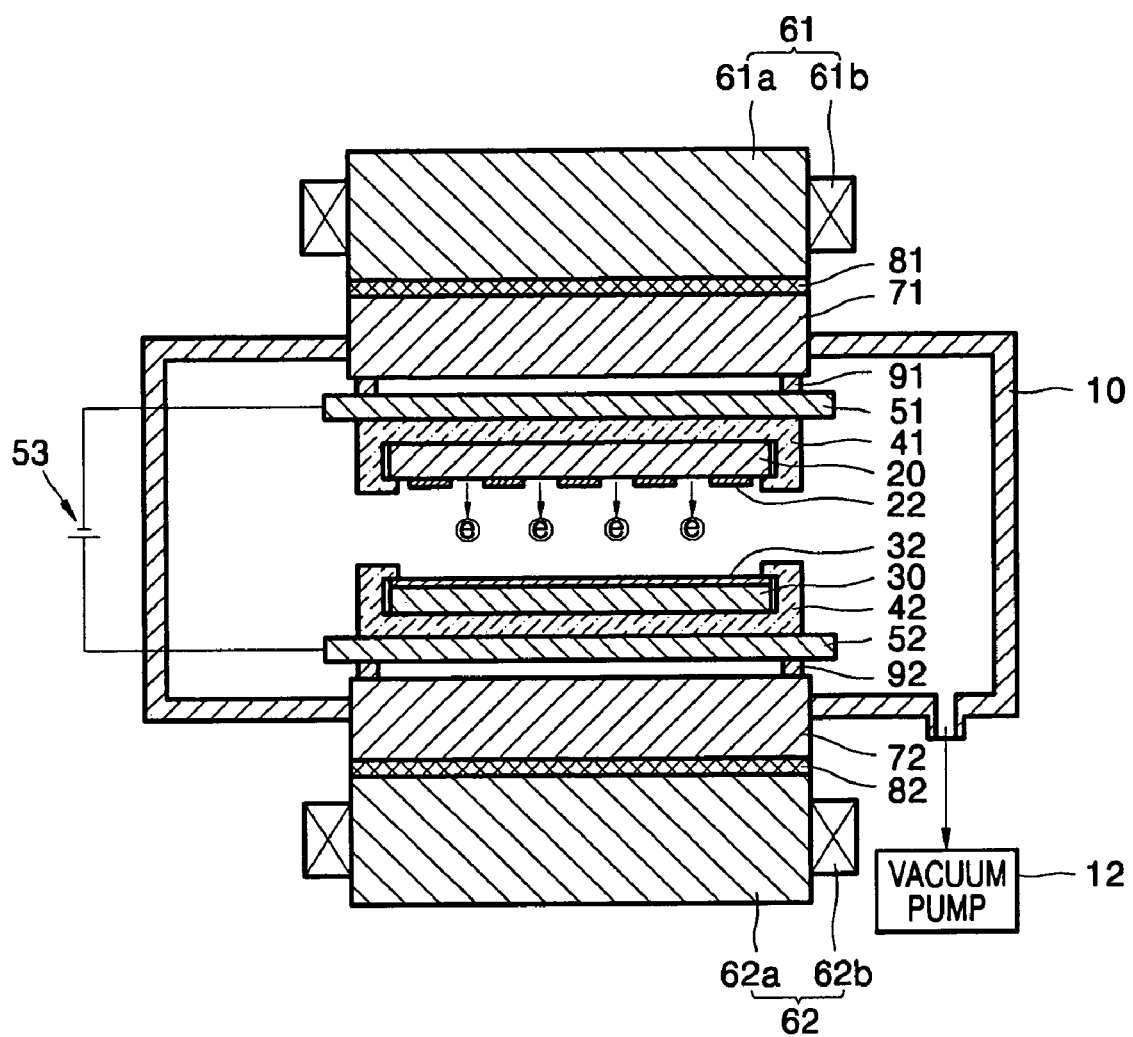
FIG. 1 is a schematic sectional view of a structure of a conventional electron-beam lithography system.

Example embodiments of the present invention will now be described more fully with reference to the accompanying drawings, in which example embodiments of the invention are shown.

The present invention will now be described more fully with reference to the accompanying drawings, in which example embodiments of the invention are shown. The invention may, however, be embodied in many different forms and should not be construed as being limited to the example embodiments set forth herein; rather, these example embodiments are provided so that this disclosure will be thorough and complete, and will fully convey the concept of the invention to those skilled in the art. Like reference numerals in the drawings denote like elements.

Example illustrative embodiments of the present invention are disclosed herein. However, specific structural and functional details disclosed herein are merely representative for purposes of describing example embodiments of the present invention. This invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the present invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 2:
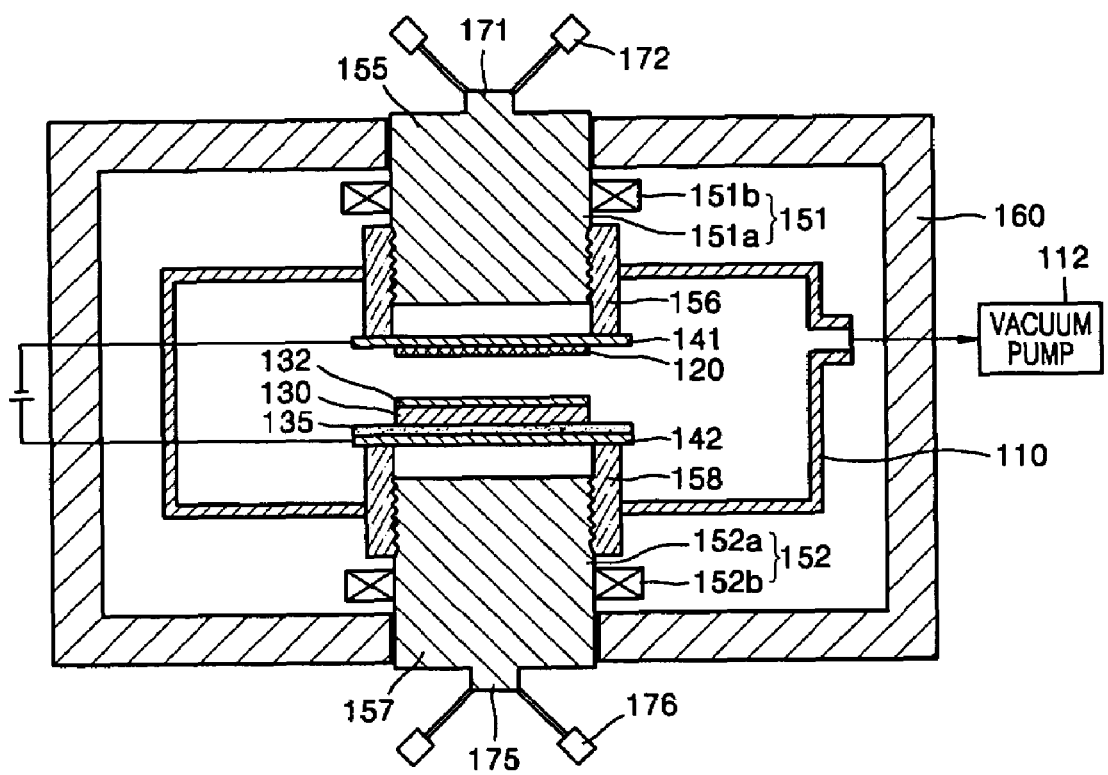
FIG. 2 is a schematic sectional view of a structure of an electron-beam lithography system according to an example embodiment of the present invention.

FIG. 2 is a schematic sectional view of a structure of an electron-beam lithography system according to an example embodiment of the present invention.

Referring to FIG. 2, an electron-beam lithography system may include a vacuum chamber 110 surrounding a space into which a wafer 130 is located, an electron-beam emitter 120 arranged in the vacuum chamber 110, and an electromagnetic focusing apparatus for controlling a path of an electron beam generated from the electron-beam emitter 120.

The interior of the vacuum chamber 110 may maintain a vacuum state through a vacuum pump 112 connected thereto. The vacuum chamber 110 may be formed of nonmagnetic material so as to reduce or prevent a magnetic flux generated by magnetic field generators 151 and 152 (will be described later) from leaking through the vacuum chamber 110. For example, the vacuum chamber 10 may be made of plastic, or may be formed of material having a magnetic permeability of near 1 and a given rigidity, such as aluminum or aluminum alloy, so as not to deform even in a high vacuum state.

The wafer 130 may be disposed at a portion within the vacuum chamber 110, and may be supported by a wafer holder 135. An electron resist 132, whose characteristic may be changed by an electron beam, may be coated on the wafer 130.

The electron-beam emitter 120 may be arranged in the vacuum chamber 110, to face the wafer 130 while being spaced apart therefrom by a desired interval. A patterned mask of a desired pattern may be coated on the electron-beam emitter 120. Accordingly, an electron beam generated at the electron-beam emitter may be emitted only through a portion not coated with the patterned mask to the electron resist 132. The emitted electron may pattern the electron resist 132 coated on the wafer 130 into a pattern identical to the pattern of the patterned mask.

The electromagnetic focusing apparatus may include magnetic field generators 151 and 152 arranged outside of the vacuum chamber 110 and which form a magnetic field in the vacuum chamber 110, and upper and lower pole pieces 151a and 152a penetrating top and bottom walls of the vacuum chamber 110, respectively and being arranged to face each other. The upper and lower pole pieces 151a and 152a may apply magnetic fields formed at the magnetic field generators 151 and 152 into the vacuum chamber 110, and may be made of ferromagnetic material. In an example embodiment, the magnetic field generators 151 and 152 are electromagnets having the upper and lower pole pieces 151a and 152a as their cores, respectively, so as to adjust their magnetic field strengths. In an example embodiment, coils 151b and 152b wound around a periphery of the upper and lower pole pieces 151a and 152a protruding outside of the vacuum chamber 110, respectively as shown in FIG. 2. In an example embodiment, the upper and lower pole pieces 151a and 152a are part of the magnetic field generators 151 and 152, respectively.

The electromagnetic focusing apparatus may further include a magnetic path unit 160 via which a magnetic flux generated at the magnetic field generators 151 and 152 moves from the upper pole piece 151a, passes through the chamber 110 and the lower pole piece 152a, and circulates back to the upper pole piece 151a. As shown in FIG. 2, the magnetic path unit 160 may surround upper, lower, left and right sides of the vacuum chamber 110, and magnetically comes into contact with the upper and lower pole pieces 151a and 152a which protrude outside of the vacuum chamber 110. Due to the magnetic path unit 160, the electromagnetic focusing apparatus may form a closed magnetic circuit having an air gap between the upper and lower pole pieces 151a and 152a. In an example embodiment, the magnetic path unit 160 may be made of ferromagnetic material. Because an air gap is formed between the upper and lower pole piece 151a and 152a, a uniform magnetic field may be formed between the upper and lower pole pieces 151a and 152a, and a magnetic field may not be unnecessarily dispersed to the other portions of the vacuum chamber 110. Accordingly, a magnetic flux can be more efficiently and/or uniformly focused between the electron-beam emitter 120 and the wafer 130.

In example embodiments of the present invention, the upper and lower pole pieces 151a and 152a can be moved vertically with respect to the vacuum chamber 110. FIG. 2 illustrates an example structure for vertically moving the upper and lower pole pieces 151a and 152a. That is, screw threads may be formed on the peripheries of the upper and lower pole pieces 151a and 152a, and upper and lower reinforcement members 156 and 158 respectively surrounding the peripheries of the upper and lower pole pieces 151a and 152a may be arranged to penetrate the top and bottom walls of the vacuum chamber 110. As shown in FIG. 2, screw threads may be formed on the inner peripheries of the upper and lower reinforcement members 156 and 158. Accordingly, the clockwise or counterclockwise rotation of the upper and lower pole pieces 151a and 152a can cause vertical movement thereof. In an example embodiment, in order to facilitate the rotation of the upper and lower pole pieces 151a and 152a, a rotation axis 171 and a handle 172 may be arranged at an upper end of the upper pole piece 151a, and a rotation axis 175 and a handle 176 may be formed at a lower end of the lower pole piece 151b. In other example embodiments, the vertical movement of the upper and lower pole pieces 151a and 152a may be realized through other modified structures.

Also, the upper and lower reinforcement members 156 and 158 may reinforce the connection between the vacuum chamber 110 and the upper and lower pole pieces 151a and 152a. The interior of the vacuum chamber 110 can maintain a vacuum state because the upper and lower pole pieces 151a and 152a are movably connected to the vacuum chamber 110 in a bolt-nut connection structure using the upper and lower reinforcement members 156 and 158.

As shown in FIG. 2, the end portions of the upper and lower reinforcement members 156 and 158 may protrude farther into the inside of the vacuum chamber 110 than the end portions of the upper and lower pole pieces 151a and 152a. The protruded end portions of the upper and lower reinforcement members 156 and 158 may constitute a ring-type magnetic field compensator for improving uniformity of a magnetic field formed between the electron-beam emitter 120 and the wafer 130. That is, the ring-type magnetic field compensator protruding from edge portions of the upper and lower pole pieces 151a and 152a may reduce or prevent magnetic fields formed at the edge portions of the pieces 151a and 152a from being curved. In an example embodiment the upper and lower reinforcement members 156 and 158 may be made of ferromagnetic material. Further, the inside diameters of the upper and lower reinforcement members 156 and 158 may be larger than the outside diameter of the wafer 130.

In an example embodiment, upper and lower electrode plates 141 and 142 for forming an electric field between the electron-beam emitter 120 and the wafer 130 may be arranged on the protruded end portions of the upper and lower reinforcement members 156 and 158 in such a way to face each other and to be spaced apart from each other by a given interval. As shown in FIG. 2, a power source may be connected to the upper and lower electrode plates 141 and 142. Due to an interaction between an electric field formed between the upper and lower electrode plates 141 and 142 and a magnetic field formed between upper and lower pole pieces 151a and 152a, an electron beam emitted from the electron-beam emitter 120 ma be guided to an accurate position on the electron resist 132.

A wafer holder 135 for fixing the wafer 130 may be arranged on an upper surface of the lower electrode plate 142. The electron-beam emitter 120 may be formed on the upper electrode plate 141 so as to face the wafer holder 135. In an example embodiment, the outside diameters of the upper and lower electrode plates 141 and 142 are preferably larger than those of the wafer 130. Although not shown in FIG. 2, the upper electrode plate 141 and the electron-beam emitter 120 may include therebetween an electron-beam emitter holder for fixing the electron-beam emitter 120, and a heater for heating the electron-beam emitter 120 for emitting an electron beam.

In an example embodiment, the vacuum chamber 110, the upper and lower electrode plates 141 and 142, and the upper and lower reinforcement members 156 and 158 may be completely sealed with each other so as to maintain the vacuum state of the vacuum chamber 110.

The conventional electron-beam lithography system shown in FIG. 1 cannot suitably compensate for a wafer size change due to a temperature change because the upper and lower pole pieces 71 and 72 are fixed to the vacuum chamber 10, whereby the mask pattern of the electron-beam emitter 20 is not correctly matched with the pattern of the electron resist 32. However, the electron-beam lithography system in accordance with example embodiments of the present invention may suitable adjust the uniformity of a magnetic field according to a temperature change because the upper and lower pole pieces 151a and 152a can be freely moved vertically, whereby the mask pattern of the electron-beam emitter 120 can be correctly matched with the pattern of the electron resist 132.

Figure 4:
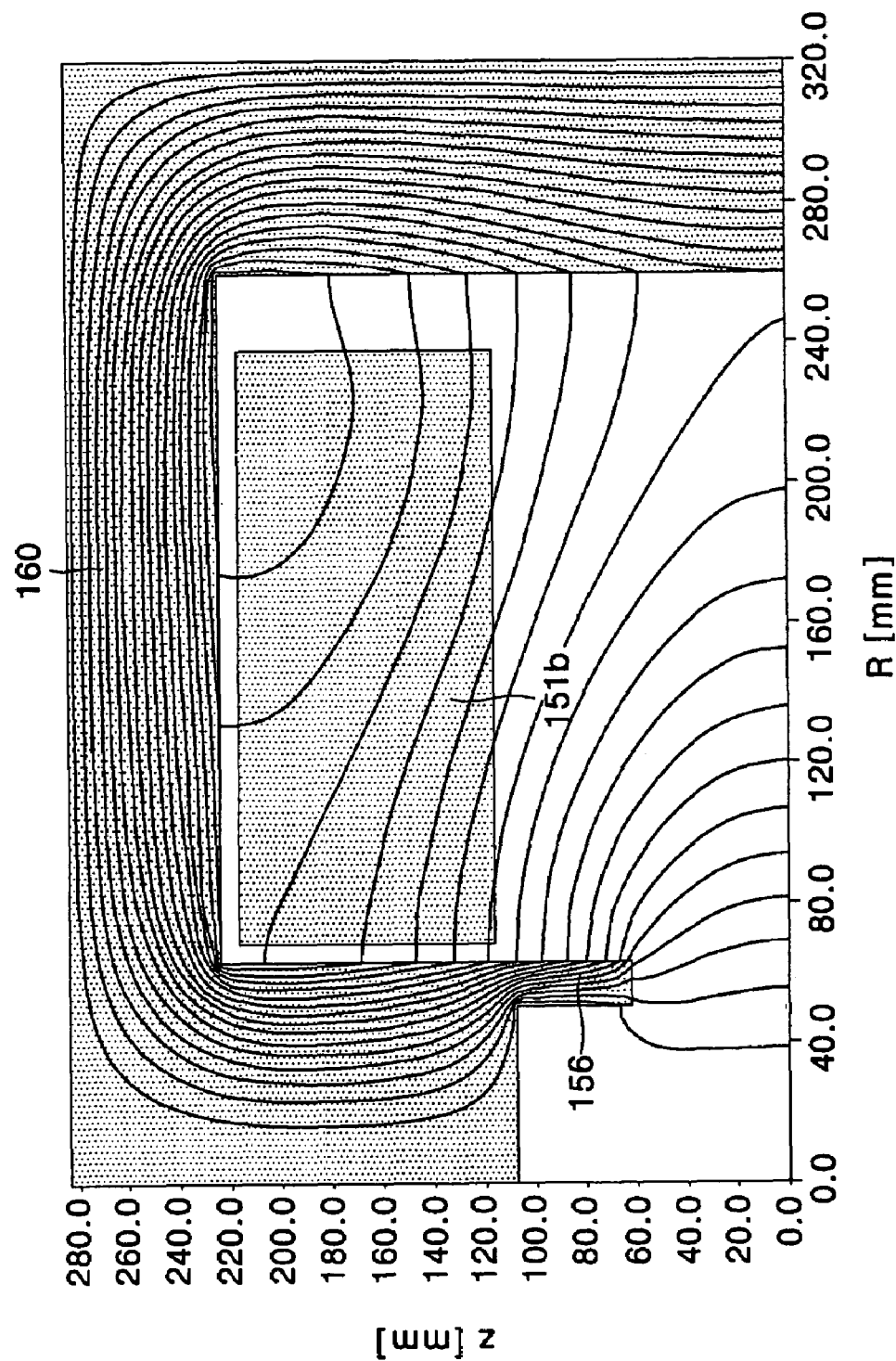
FIG. 4 is a magnetic field distribution chart obtained by simulating the distribution of a magnetic field generated by the electron-beam lithography system according to an example embodiment of the present invention.

FIG. 4 is a magnetic field distribution chart obtained by simulating the distribution of a magnetic field generated by the electron-beam lithography system according to an example embodiment of the present invention.

In the magnetic field distribution chart shown in FIG. 4, the origin represents the center of the vacuum chamber 110, a longitudinal axis (or Z-axis) a distance in a direction of the upper pole piece 151a, and a transverse axis a distance in a radial direction, respectively.

The upper reinforcement member 156, the upper coil 151b and the magnetic path unit 160 are schematically illustrated in FIG. 4 in a right direction from the center of the upper pole piece 151a. A magnetic field is uniformly formed right below the upper pole piece 151a.

Figure 5:
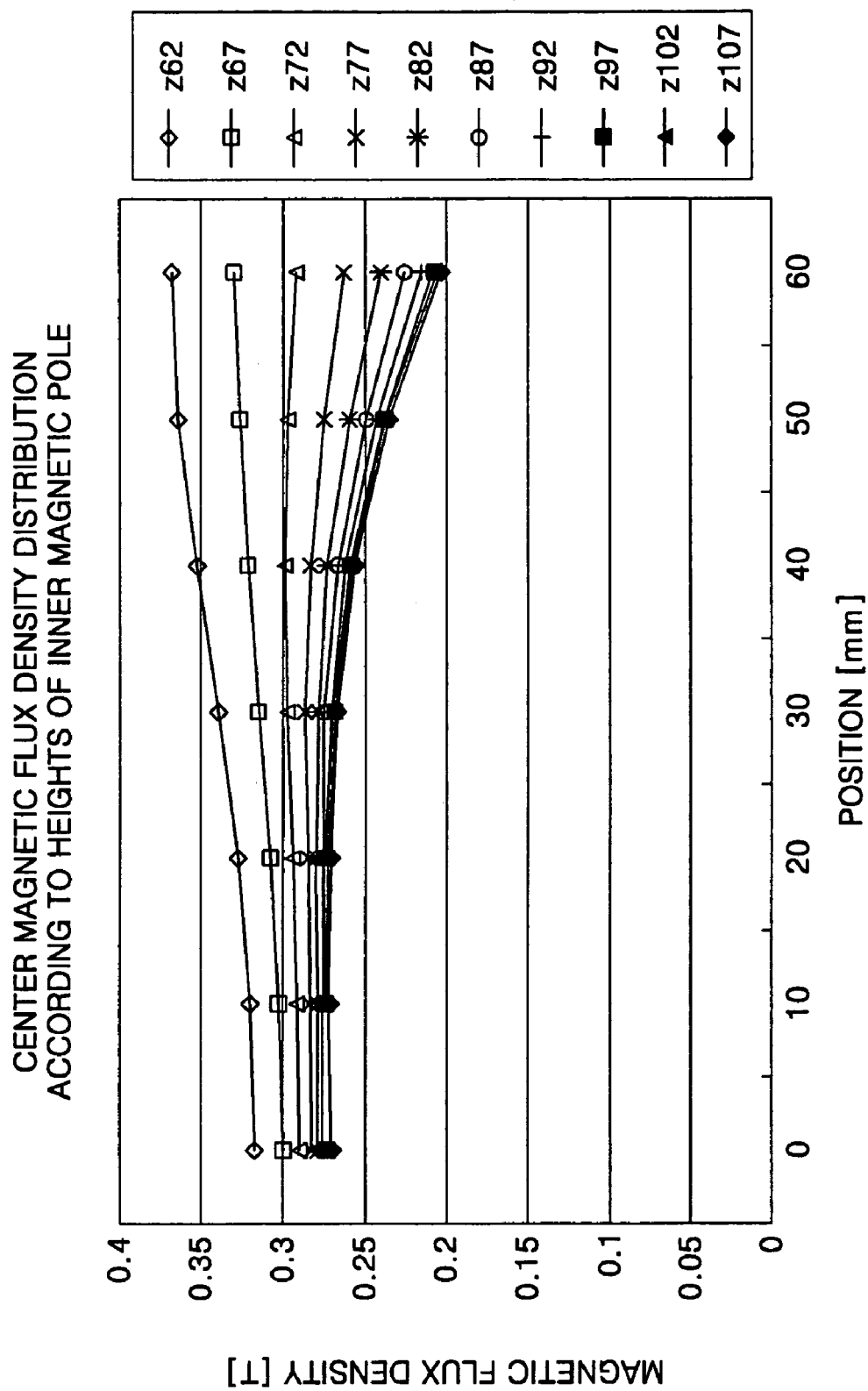
FIG. 5 is an example graph illustrating a magnetic field variation curve according to the movement of a pole piece in the electron-beam lithography system according to an example embodiment of the present invention.

FIG. 5 is an example graph illustrating a magnetic field variation curve of the vertical movement of a pole piece in an electron-beam lithography system according to an example embodiment the present invention.

As shown in the graph of the FIG. 5, the uniformity of a magnetic field may be changed with a change in the distance between the center of the vacuum chamber 110 and the upper pole piece 151a. For example, when the distance between the center of the vacuum chamber 110 and the upper pole piece 151a is 62 mm, a magnetic flux density increases in the radial direction from the origin. When the distance therebetween is 197 mm, a magnetic flux density decreases in the radial direction from the origin. When the distance therebetween is 72 mm, a magnetic flux density is roughly constant regardless of a radial distance.

By using the change in the uniformity of a magnetic field according to the positions of the upper and lower pole pieces 151a and 152a, an electron beam can be finely deviated in a center or radial direction by vertically moving the upper and lower pole pieces 151a and 152a. Accordingly, the mask pattern of the electron-beam emitter 120 can be more correctly matched with the pattern of the electron resist 132, regardless of a temperature change, by adjusting a magnifying factor in accordance with a wafer size change according to a temperature change in the vacuum chamber 110.

Figure 3:
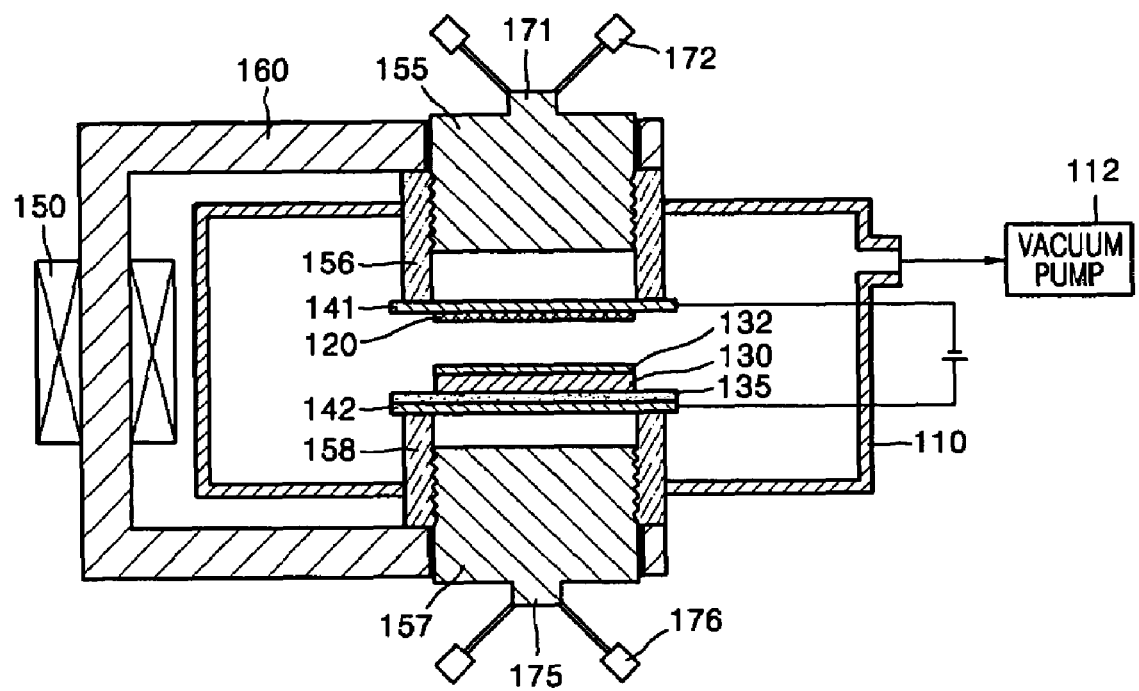
FIG. 3 is a schematic sectional view of a structure of an electron-beam lithography system according to another example embodiment of the present invention.

FIG. 3 is a schematic sectional view of a structure of an electron-beam lithography system according to another example embodiment of the present invention.

When compared with the electron-beam lithography system shown in FIG. 2, the electron-beam lithography system shown in FIG. 3 has only a left magnetic path unit 160 surrounding a left side of the vacuum chamber 110 and does not have a right magnetic path unit 160 surrounding a right side of the vacuum chamber 110. Also, only one coil 150 is wound around the periphery of the left magnetic path unit 160 in the electron-beam lithography system shown in FIG. 3, while the upper and lower coils 151b and 152b are respectively wound around the peripheries of the upper and lower pole pieces 151a and 152a in the electron-beam lithography system shown in FIG. 2. Accordingly, in the case of the electron-beam lithography system shown in FIG. 3, a magnetic field generator is an electromagnet including the coil 150. Other components in FIG. 3 may be identical to those in FIG. 2, and thus their description will be omitted.

When compared with the electron-beam lithography system shown in FIG. 2, the electron-beam lithography system shown in FIG. 3 can further reduce space, assembly time and/or cost, and/or the manufacturing time and/or cost of the magnetic field generator.

As stated above, an electromagnetic focusing apparatus in accordance with example embodiments of the present invention makes it possible to suitably compensate for a wafer size change due to a temperature change in the vacuum chamber by adjusting the uniformity of a magnetic field through the movement of the center portion of the pole piece. Accordingly, the electron resist coated on the wafer can be more accurately patterned although the temperature in the vacuum chamber is changed.

Also, an electromagnetic focusing apparatus in accordance with example embodiments of the present invention makes it possible to reduce the space of the electron-beam lithography system and the manufacturing cost of a large magnet by forming the magnetic path unit in a "[" or "]" shape.

While the present invention has been particularly shown and described with reference to example embodiments thereof, it will be understood by those of ordinary skill in the art that various changes in form and details may be made therein without departing from the spirit and scope of the present invention as defined by the following claims. For example, the magnetic path unit 160 may surround only one side of the vacuum chamber 110 in FIG. 2. Also, the magnetic path unit 160 may surround the both sides of the vacuum chamber 110 in FIG. 3. Additionally, although the interaction between the upper and lower pole pieces 151a and 152a and the upper and lower reinforcement members 156 and 158 is shown in example embodiments as a thread interaction, other mechanisms, including, for example, piston and cylinder may also be used.

What is claimed is:

1. A focusing apparatus for controlling a path of an electron beam generated from an electron-beam emitter of a lithography system, the apparatus comprising:
    a magnetic field generator, forming a magnetic field between a first pole piece and a second pole piece of the magnetic field generator; and
    a vacuum chamber; wherein,
        a portion of the first pole piece, being partially within a boundary of the vacuum chamber;
        the first pole piece, being adjustably movable with respect to the second pole piece to adjust a uniformity of the magnetic field between the first pole piece and the second pole piece; and
        a first and a second reinforcement member, surrounding a periphery of the first and second pole pieces, respectively, and being partially within the boundary of the vacuum chamber.

2. The apparatus of claim 1, wherein the portion of the first pole piece is vertically movable with respect to the vacuum chamber.

3. The apparatus of claim 2, wherein the portion of the first pole piece interacts with a portion of the vacuum chamber to move vertically with respect to the vacuum chamber.

4. The apparatus of claim 3, wherein the portion of the first pole piece and the portion of the vacuum chamber each include threads to vertically move the portion of the first pole piece with respect to the vacuum chamber.

5. The apparatus of claim 1, wherein the first and second pole pieces are arranged to face each other.

6. The apparatus of claim 5, wherein the first and second pole pieces are ferromagnetic.

7. The apparatus of claim 6, wherein magnetic field generator is an electromagnet including a core and coils, the core being the first and second pole pieces, and the coils being wound around peripheries of the first and second pole pieces, respectively, protruding outside the vacuum chamber.

8. The apparatus of claim 7, further comprising a magnetic path unit outside the vacuum chamber, having a first end portion and a second end portion in contact with the first and second pole pieces to provide a path for the magnetic field outside the vacuum chamber.

9. The apparatus of claim 8, wherein the magnetic path unit is ferromagnetic.

10. The apparatus of claim 6, wherein the magnetic field generator is an electromagnet including:
  a magnetic path unit having a first end portion and a second end portion in contact with the first and second pole pieces; and
  a coil wound around a periphery of the magnetic path unit.

11. The apparatus of claim 10, wherein the magnetic path unit is ferromagnetic and surrounds at least one of left and right sides of the vacuum chamber.

12. The apparatus of claim 5, wherein
  the first and second reinforcement members are ferromagnetic,
  the first and second reinforcement members being movably connected to the first and second pole pieces, respectively, through a screw thread formed on inner peripheries of the first and second reinforcement members and a screw thread formed on outer peripheries of the first and second pole pieces.

13. The apparatus of claim 12, wherein end portions of the first and second reinforcement members further protrude inside the vacuum chamber farther than end portions of the first and second pole pieces, to thereby form a ring-type magnetic field compensator.

14. A lithography system comprising:
  a magnetic field generator, forming a magnetic field in a space between a first pole piece and a second pole piece of the magnetic field generator;
  a vacuum chamber enclosing the space; and
  an electron-beam emitter arranged in the space to face a location for a wafer, being spaced apart from the location by a given interval and emitting an electron beam toward the location; wherein,
    a portion of the first pole piece being arranged partially within a boundary of the vacuum chamber;
    the first pole piece, being adjustably movable with respect to the second pole piece to adjust a uniformity of the magnetic field between the first pole piece and the second pole piece; and
    a first and a second reinforcement member, surrounding a periphery of the first and second pole pieces, respectively, and being partially within the boundary of the vacuum chamber.

15. The system of claim 14, wherein the portion of the magnetic field generator is vertically movable with respect to the vacuum chamber.

16. The system of claim 15, wherein the portion of the first pole piece interacts with a portion of the vacuum chamber to move vertically with respect to the vacuum chamber.

17. The system of claim 16, wherein the portion of the first pole piece and the portion of the vacuum chamber each include threads to vertically move the portion of the first pole piece with respect to the vacuum chamber.

18. The system of claim 14, wherein the first and second pole pieces are arranged to face each other.

19. The system of claim 18, wherein the first and second pole pieces are ferromagnetic.

20. The system of claim 19, wherein the magnetic field generator is an electromagnet including a core and coils, the core being the first and second pole pieces, and the coils being wound around peripheries of the first and second pole pieces, respectively, protruding outside the vacuum chamber.

21. The system of claim 20, further comprising a magnetic path unit outside the vacuum chamber, having a first end portion and a second end portion in contact with the first and second pole pieces to provide a path for the magnetic field outside the vacuum chamber.

22. The system of claim 21, wherein the magnetic path unit is ferromagnetic.

23. The system of claim 19, wherein the magnetic field generator is an electromagnet including:
  a magnetic path unit having a first end portion and a second end portion in contact with the first and second pole pieces protruding outside the vacuum chamber, respectively; and
  a coil wound around a periphery of the magnetic path unit.

24. The apparatus of claim 23, wherein the magnetic path unit is ferromagnetic and surrounds at least one of left and right sides of the vacuum chamber.

25. The system of claim 18, wherein the vacuum chamber is made of nonmagnetic material.

26. The system of claim 18, wherein
  the first and second reinforcement members are ferromagnetic, and
  the first and second reinforcement members being movably connected to the first and second pole pieces, respectively, through a screw thread formed on inner peripheries of the first and second reinforcement members and a screw thread formed on outer peripheries of the first and second pole pieces.

27. The system of claim 26, wherein end portions of the first and second reinforcement members protrude into an inside of the vacuum chamber farther than end portions of the first and second pole pieces, respectively, to thereby form a ring-type magnetic field compensator.

28. The system of claim 26, wherein first and second electrode plates are arranged on end surfaces of the first and second reinforcement members, respectively, in such a way to face each other and to be spaced apart from each other by a given interval, and form a magnetic field between the electron-beam emitter and the wafer.

29. The system of claim 28, wherein a wafer holder fixing the wafer is arranged on the second electrode plate and the electron-beam emitter is arranged on the first electrode plate in such a way to face the wafer holder.

30. The system of claim 28, wherein inside diameters of the first and second reinforcement members are larger than an outside diameter of the wafer.

31. The system of claim 28, wherein outside diameters of the first and second electrode plates are larger than an outside diameter of the wafer.

32. An electromagnetic focusing apparatus for controlling a path of an electron beam generated from an electron-beam emitter of an electron-beam lithography system, the apparatus comprising:
  a magnetic field generator, forming a magnetic field between the first pole piece and a second pole piece of a magnetic field generator;
  a vacuum chamber; wherein,
    a portion of the first pole piece and second pole piece, being partially within a boundary of the vacuum chamber; and
    the first pole piece and second pole piece, being adjustably movable with respect to vacuum chamber, respectively, to adjust a uniformity of the magnetic field between the first pole piece and the second pole piece; and
    a first and a second reinforcement member, surrounding a periphery of the first and second pole pieces, respectively, and being partially within the boundary of the vacuum chamber.

* * * * *